INVENTOR
J. S. BELL
BY [signature]
ATTORNEY

CRYSTAL CONTROLLED OSCILLATOR

Filed Nov. 28, 1947

3 Sheets-Sheet 2

INVENTOR
J. S. BELL
BY W. C. Parnell
ATTORNEY

May 19, 1953 J. S. BELL 2,639,387

CRYSTAL CONTROLLED OSCILLATOR

Filed Nov. 28, 1947 3 Sheets-Sheet 3

INVENTOR
J. S. BELL
BY [signature]
ATTORNEY

Patented May 19, 1953

2,639,387

UNITED STATES PATENT OFFICE 2,639,387

CRYSTAL CONTROLLED OSCILLATOR

James S. Bell, Scotch Plains, N. J., assignor to Western Electric Company, Incorporated, New York, N. Y., a corporation of New York Application November 28, 1947, Serial No. 788,501

9 Claims. (Cl. 250—36)

This invention relates to oscillators of the type comprising an amplifier with positive feed back connections between the output and the input and a piezo electric crystal connected in the feed back loop for determining the frequency of the resulting oscillations.

For stability of the oscillator frequency it is essential that the crystal be not subjected to excessive voltage or current which would change its resonant frequency appreciably either permanently or temporarily. Crystals which have been cut so as to have zero or relatively low temperature coefficients to make the oscillator relatively independent of ambient temperature are, of course, less sensitive than other types to the value of the current through them. In any case, however, precautions should be taken to ensure that the crystal current does not become large enough either to produce excessive heating or to fracture the crystal.

Oscillators of this general type have been proposed heretofore in which there are provided a number of frequency determining crystal units and selecting keys so that by proper choice of the unit connected into the circuit, oscillations of any one of a number of discrete frequencies may be obtained. The accuracy of the frequencies produced in this way depends on careful control of the capacities, particularly the stray direct capacity across the terminals of the crystal units and the stray capacities to ground. When a high degree of accuracy in the frequency of the oscillator is required, these stray capacities present a considerable problem, even in a single frequency oscillator of this type; but when the oscillator is to provide any of a large number of frequencies extending over a wide range, the condition is greatly aggravated by the presence of capacity between the oscillating crystal and the other crystals not in use. Since it is impracticable to locate a large number of crystals close to both the oscillating circuit and the switching keys at the operator's position, the stray capacity between the leads of the crystals becomes a serious factor in impairing the accuracy of the oscillator frequency.

When, due to stray capacity defects or for other reasons, the frequency of a crystal oscillator is found to be incorrect, it is of course possible to adjust it to some extent by the use of added trimming condensers or inductances, or both, in series with or shunting the crystal. If any considerable adjustment of frequency is attempted by such means, however, the energy loss in the crystal circuit becomes excessive and may cause frequency instability or prevent the circuit from oscillating at all.

The general object of this invention is to improve the frequency stability and accuracy of crystal controlled oscillators.

To this end the potential applied to the crystal and the current therethrough are regulated at safe values by means of a control amplifier which in general is provided with input potential proportional to the potential or current to be regulated, and supplies a control signal which automatically varies the trans-conductance of the tube or tubes of the oscillator. This control amplifier and its connections may be any one of several types, depending on the requirements of the particular case.

In cases where the usual buffer tube is used to couple the oscillator to its work circuit, the amplifier may be of the direct current type and of small power capacity since the voltage to be regulated, or a portion thereof, may be rectified and opposed by a static potential which balances the rectified potential when the crystal current is at normal operating level. The control amplifier then is actuated only by the difference in these potentials and provides for regulating purposes a potential which is very sensitive to changes in crystal current. If desired, the potential to be regulated may be amplified directly by an alternating current amplifier and all or a portion of the output rectified and used to provide the control potential for the tubes of the oscillator. In this case, since good control usually requires a multi-tube amplifier of good power capacity, the oscillator output can be taken off from the output of the control amplifier and no extra buffer is required.

According to a further important feature of the invention, the crystal frequency determining units of a multi-frequency oscillator are mounted together at any convenient location remote from the oscillator operating position. Switching of the units is effected by keys located at the operating position and controlling relays located adjacent the units and provided with contacts for grounding all the units, except the one selected, to reduce their coupling with the oscillating crystal. For higher frequency applications, this coupling may be reduced further by dividing the units and their controlling relays into banks and selecting the proper bank and the individual unit in the bank so that most of the units not in use are isolated completely from the oscillating circuit.

In the drawing, Fig. 1 is an oscillator according to the invention with an alternating current or signal amplifying control amplifier used also as a buffer and a plurality of crystal units for selective connection into the oscillating circuit;

Figure 2:
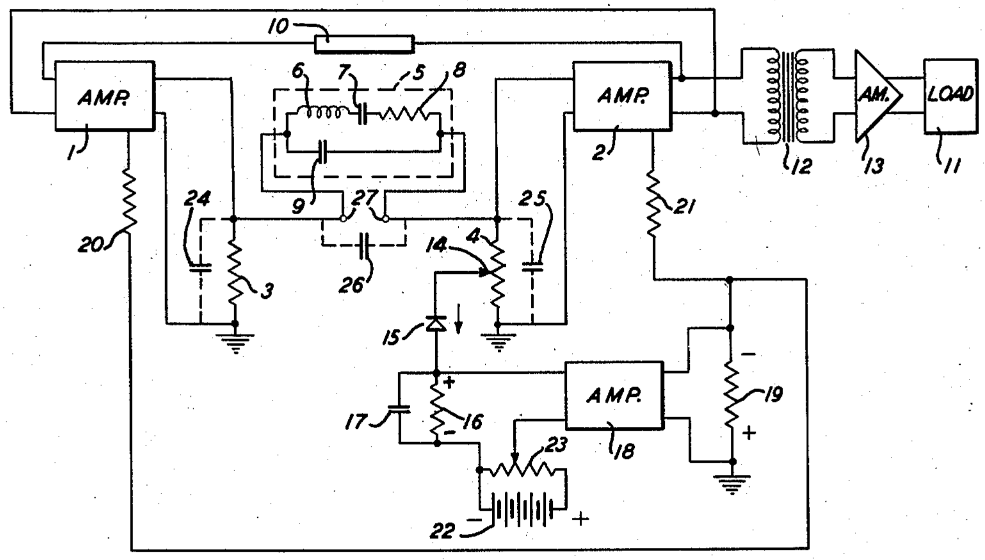
Fig. 2 is a simplified schematic of an oscillator according to the invention showing a direct current type of control amplifier and certain of the stray capacities which complicate the design of such an oscillator.

Referring first to Fig. 2, conventional amplifiers 1 and 2 are coupled by a network comprising a resistor 3 in the output of the amplifier 1, a resistor 4 in the input of amplifier 2, and a frequency determining crystal 5 which has the electrical characteristics of a network comprising an inductance 6, a capacitance 7, and a resistance 8 effectively in series, and a second capacitance 9 in parallel with this series combination. The output of amplifier 2 is connected back directly, or through a suitable network 10, to the input of the amplifier 1 in such a manner that the resulting loop oscillates at a frequency determined by the series resonant frequency of the crystal. The oscillating energy generated is applied to any work circuit 11 through a transformer 12 and a buffer amplifier 13.

When the circuit is oscillating, the potentials developed across resistor 4 are proportional to the current through the crystal, and this current therefore may be regulated by controlling the gain of either or both of the amplifiers 1 and 2 according to the magnitude of these potentials. A suitable proportion of these potentials is selected by an adjustable connection 14 and impressed on a rectifier 15 and a resistor 16, shunted by a smoothing condenser 17 and disposed in the input circuit of a direct current amplifier 18. The output circuit of this amplifier is terminated in a suitable resistance 19 and the potential developed across this resistance is applied as a negative bias through resistors 20 and 21 to the amplifiers 1 and 2, respectively, to regulate their gain. In order to reduce the power capacity required in the amplifier 18 and to make the circuit very sensitive to changes in crystal current, the potential developed across resistor 16, when the crystal current is at the proper value, is balanced out by a static opposing potential which may be derived from a battery 22 and adjusted to the proper value by a potentiometer 23, as shown. Then as the crystal current varies from its proper value, potentials of a polarity and magnitude representing the change in the crystal current will be amplified to increase or decrease the normal bias on the amplifiers as required.

As is well known, the operation of such a circuit as an oscillator at the series resonant frequency of the crystal unit depends on having the phase shift around the feedback loop substantially zero or a multiple of $2\pi$ radians at the resonant frequency. This presents no new problem in so far as the amplifiers are concerned, but the use of the coupling network introduces various stray capacities, such as 24 and 25, which are effectively across the resistors 3 and 4 and capacity 26 across the terminals 27 of the crystal. When the circuit is to be used to generate frequencies extending over a wide high frequency range, the effect of these stray capacities on the accuracy of the frequency generated and on the stability of the circuit becomes increasingly important as the frequency is raised. Since the effective frequency range of the circuit is limited by the shunting effect of the capacity 26 and the phase shift and insertion loss effects of the capacities 24 and 25, these capacities must be kept as small as possible. The minimum values of capacities 24 and 25 are determined by the inherent capacities to ground of the necessary wiring and circuit components, but by means of circuit features to be described, the total shunt capacity 26 may be kept very low even when many crystals are provided for the selective control of the oscillator frequency.

Figure 1:
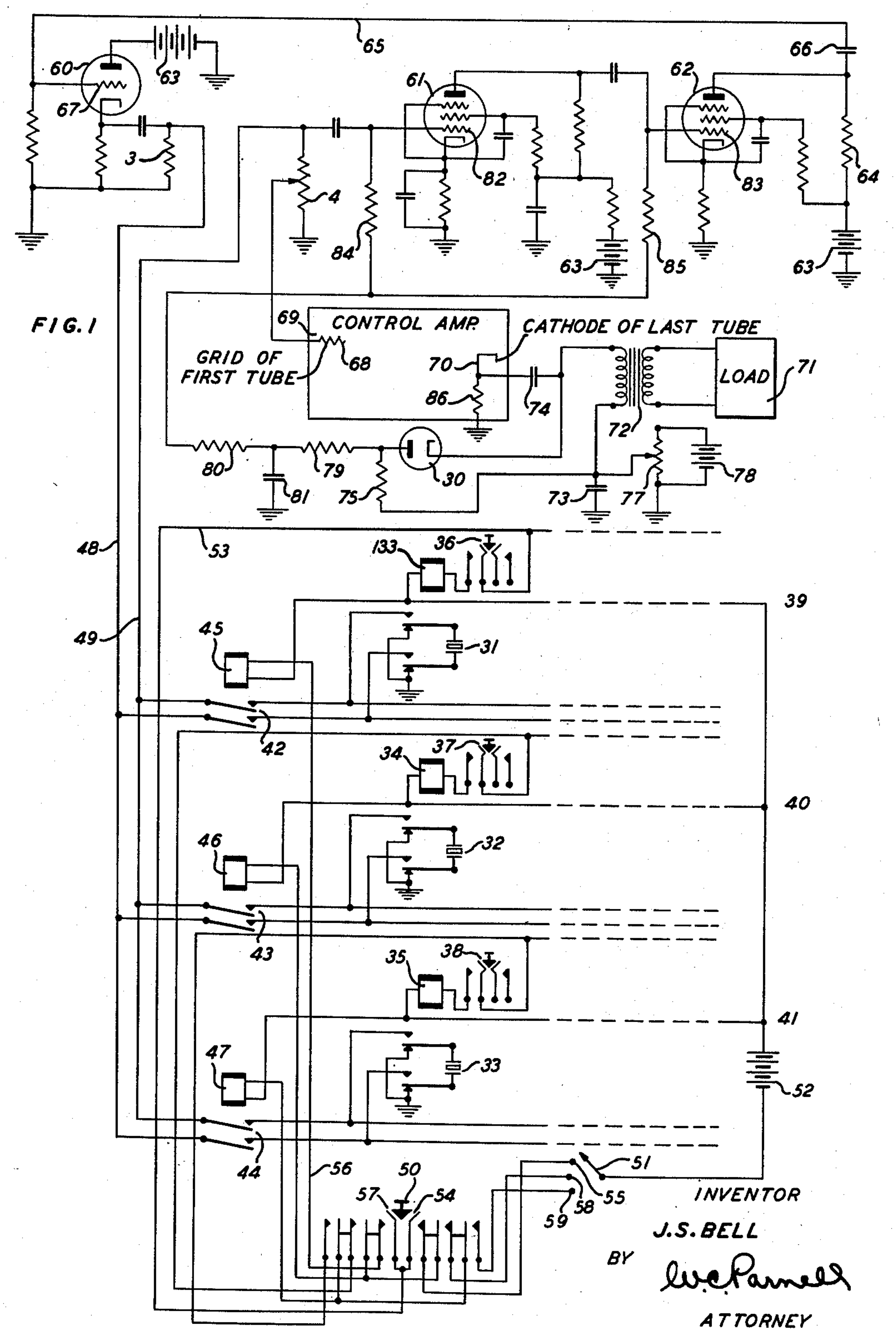

The circuit of Fig. 1 embodies an oscillator of the general type shown in Fig. 2 with certain changes and additions. In this case, any desired number of crystal units, such as 31, 32, and 33, each resonant at a different frequency, and being of the general type of crystal 5 in Fig. 2, are mounted near the oscillator circuit. Each crystal is connected to the normally grounded contacts of a relay, such as 133, 34, or 35, and each relay is controlled by a key, 36, 37, or 38, all such keys being located for convenience at the operation position of the oscillator. The crystals and their controlling relays are arranged in banks, such as 39, 40, and 41, and the operation of any key connects the corresponding crystal to the bank bus bars 42, 43, or 44, so that upon the operation of the bank relay 45, 46, or 47, the selected crystal will be connected through leads 48 and 49 to the oscillator circuit. Only three crystal banks and only one crystal per bank are shown, but it will be understood that the number of banks and number of crystals per bank may be extended to any number required in a particular case. When such an oscillator is required to produce a number of different frequencies in quick succession, as for example, in testing the response of electrical apparatus at different frequencies, this may be accomplished by means of a code key 50 and a test key 51.

Assuming, for example, that the frequencies generated by using crystals 31, 32, and 33 are required, the keys 36 to 38 will be operated. All such keys are of the locking type and preferably, they are mechanically interlocked in a well-known manner so that the operation of any key releases a previously operated key in the same bank so that two or more crystals cannot be connected to the oscillator circuit simultaneously. The code key 50 may be of the locking type or it may be held down while the test is made by operation of the test key 51. Upon operation of the key 50, the operating circuit of the relay 133 extends from the battery 52 through the relay and key 36, conductor 53 and contacts 54 of key 50 to contact 55 of the switch 51. The operating circuit of the corresponding bank relay 45 extends from the battery through the relay, conductor 56 and contacts 57 and 54 of key 50 to the same contact 55. Similar circuits are prepared for the relays 34 and 46 and for relays 35 and 47 to the contacts 58 and 59, respectively, of the switch 51. When switch 51 is closed on contact 55, relays 133 and 45 are operated to disconnect the crystal 31 from ground and connect it into the oscillator circuit to cause the circuit to generate this selected frequency. The operation of switch 51 to contact 58 releases these relays and operates relays 34 and 46 to connect in the crystal 32, and by moving the switch to contact 59, these latter relays are in turn released and relays 35 and 47 are operated to select the crystal 33.

With this circuit it will be clear that any desired code combination of test frequencies may be set up by careful preselection of the proper crystals and then these selected frequencies may be generated in succession without delay or danger of error. By using low capacity relays with the proper shielding between contacts and other known design expedients, the capacity effects of the unselected grounded crystals on the tuning capacity of the oscillator may be reduced to a very low value, and as only one bank relay is operated at any one time, the effects of the unused banks on the effective capacity of the crystal in use is made negligible.

Figure 6:
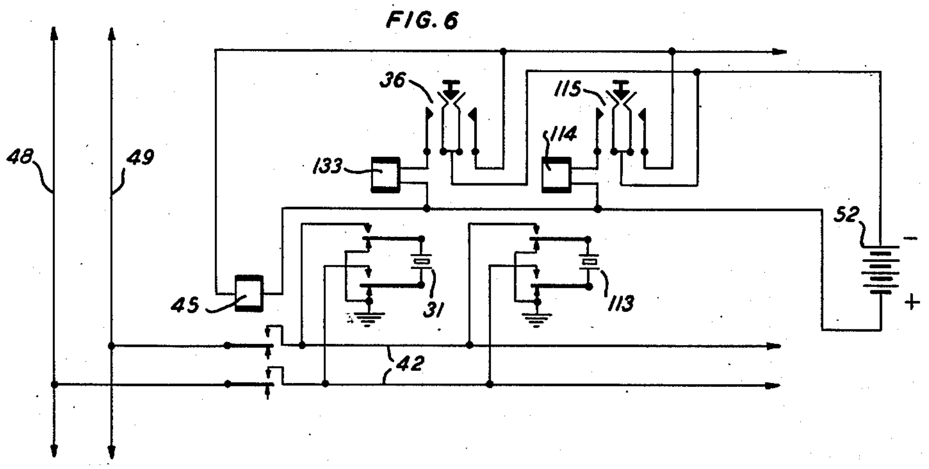
Fig. 6 is a simplified alternative to the crystal selecting circuit of Fig. 1.

In cases where code selection of frequencies is not desired, keys 50 and 51 may be eliminated and the other advantages of the invention retained by connecting the crystal to be used as shown in Fig. 6. This figure shows the upper bank relay 45, two crystal units 31 and 113 of this bank, together with the associated relays 133 and 114 and their operating keys 36 and 115. As in Fig. 1, the unselected crystals are grounded and all the keys of each bank are preferably interlocked as described above. In this modification the operation of any key, such as 36, operates both the bank relay 45 and the crystal selecting relay 133 by connecting their operating windings to the current source 52. The release of the key releases both relays, but upon operation of any other key to select another crystal, the corresponding bank relay is operated also to connect the selected crystal into the oscillator circuit.

In the circuit of Fig. 1 the selected crystal unit is serially connected between the shunt resistors 3 and 4, as in Fig. 2, and serves as a coupling between the amplifying tube 60 and the tandem tubes 61 and 62. These amplifying stages are per se conventional and the plate supply source, shown as a battery 63, in practice ordinarily will be a power supply unit. The output of tube 62 is terminated in a resistor 64 and a feedback connection 65 extends from the plate of tube 62 through a blocking condenser 66 to the grid 67 of the tube 60 to cause the circuit to oscillate. In this case, the alternating potentials across resistor 4 are applied directly to grid 68 of the first tube in the control amplifier 69 which may have any required number of stages, including a power output tube having a cathode 70. The useful output of the oscillator is taken off at this point and supplied to a load 71 by a transformer 72 having a primary winding with one terminal grounded through a condenser 73 and the other terminal connected to the cathode through a condenser 74.

A rectifier 30, such as a diode, is connected in series with a resistor 75 and a portion of a potentiometer 77 across the amplifier output to rectify the negative pulses at the cathode 70. Since the potentiometer 77 is connected across a battery or other source of potential 78, positive potential is applied to the grids 82 and 83 of tubes 61 and 62, respectively, through resistors 75, 79, 80, 84, and 85. When power is first applied to the oscillator, the trans-conductance of tubes 61 and 62, therefore, is very high and the circuit immediately begins to oscillate. As the current through the crystal of the oscillator builds up, the output of the control amplifier increases correspondingly and the negative pulses of its output are rectified by the diode 30. The diode current from ground up through potentiometer 77 and resistor 75 produces across these impedances a pulsating potential drop which is smoothed by the filter elements 79, 80, and 81 in the well-known manner and applied as a negative bias to the grids of the tubes 61 and 62. This increasing negative bias decreases the trans-conductance of the tubes, and the circuit constants are such that the amplitude of the oscillations is limited at a safe value of current through the crystal. The operation of the circuit is stabilized at this value of crystal current for if the current tends to decrease again, the output of rectifier 30 also decreases and the trans-conductance of tubes 61 and 62 is increased to restore the crystal current to the proper value. It will be understood that in some cases, the gain controlling bias may be applied to only a single tube and in others it may be applied also to additional tubes such as 60 if required.

Figure 3:
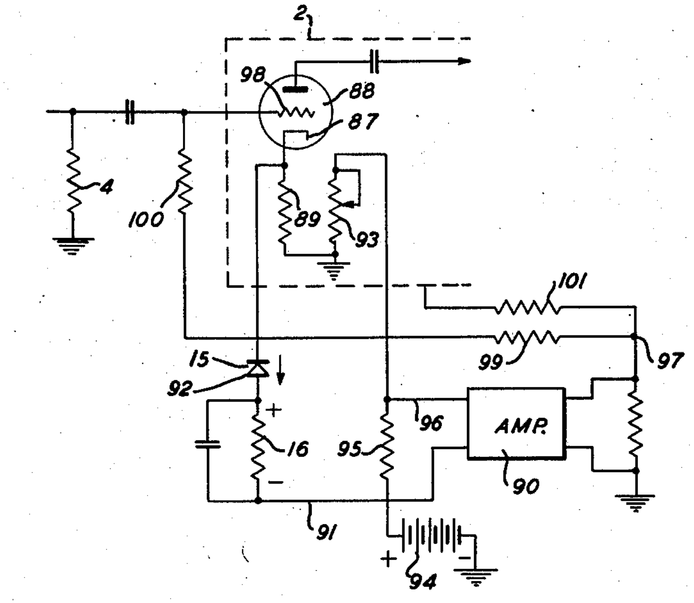
Fig. 3 is a partial schematic showing a modification of the circuit of Fig. 2.

In the modification of Fig. 2, shown in Fig. 3, the rectifier 15 is connected to the cathode 87 of the first tube 88 in the amplifier 2, thereby obtaining an alternating potential proportional to the crystal current but of large magnitude in accordance with the gain of the tube. The conductor 91 is at a positive potential with respect to ground since it is conductively connected to cathode 87, but it is desirable to apply to the control amplifier 90 only the potential due to rectified signal current. Amplification of the undesired direct current potential is therefore prevented and suitable bias for the cathode 92 of the rectifier is obtained by means of an adjustable resistor 93 connected from ground to a source of positive potential 94, through a resistor 95, to bring the amplifier lead 96 to the same positive potential as the lead 91 when the circuit is not oscillating. When the crystal current is of sufficient magnitude to cause the rectifier 15 to conduct during positive signal pulses at the cathode 87, these pulses will be rectified and will cause point 97 in the output circuit of the amplifier to be negative with respect to ground to an extent determined by the magnitude of the crystal current. This negative bias is applied to the grid 98 of the tube 86 through resistors 99 and 100, and if desired, it may be applied through resistor 101 to the grids of one or more other tubes in the amplifier 2 to obtain additional gain controlling action.

Figure 4:
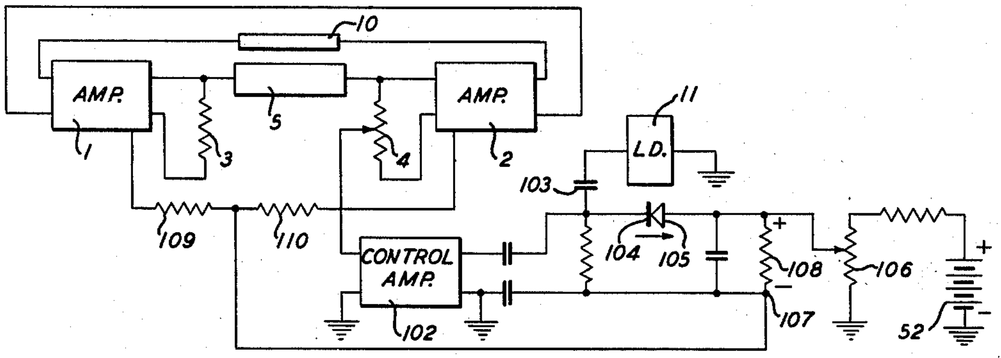
Fig. 4 is a simplified schematic of portions of Fig. 1 showing particularly a distortion reducing feature.
Figure 5:
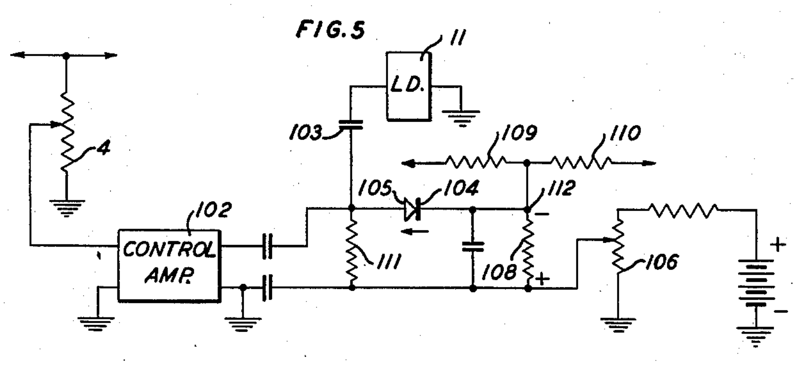
Fig. 5 is a modification of the circuit of Fig. 4.

The modification shown in Fig. 4 is generally similar to the circuit of Fig. 2 except that the control amplifier 102 receives alternating signal potential from a suitable tap on resistor 4 and supplies power to the load 11 through a condenser 103. A portion of this alternating output is rectified by rectifier 104 and used to regulate the crystal current. As in the case of the circuit of Fig. 1, a potentiometer 106 supplies positive bias for the amplifying tubes through resistors 108, 109, and 110 to cause the circuit to oscillate and as soon as oscillations begin, the rectified current down through resistor 108 produces a potential drop therein in opposition to the positive bias from potentiometer 106. As the rectified current increases, the lower end 107 of resistor 108 becomes negative with respect to ground, the amplifying tubes are negatively biased, and the oscillating circuit stabilizes at the desired value of crystal current. The partial circuit of Fig. 5 is the same as the corresponding part of Fig. 4 except that the rectifier 104 is oppositely poled, the cathode is biased from potentiometer 106 through resistor 111, and the resistors 109 and 110 are connected to point 112 which is now the negative end of the resistor 108.

In the output wave of an oscillator, the negative pulses of the wave usually have less distortion than the positive pulses and hence, when half wave rectifiers are used, better gain control is obtained by rectifying the negative half waves. When this is a controlling factor, the preferred poling of a rectifier in the output of a control amplifier will depend on whether this amplifier has an odd or an even number of stages. For an odd number of stages the positive pulses of the amplifier output should be rectified by poling the rectifier as shown in Fig. 4, but for an amplifier with an even number of stages, the rectifier should be poled as shown in Fig. 5 to rectify the negative pulses since these correspond to the negative pulses of the oscillator. On the other hand, if the distortion arising in the control amplifier is greater than the distortion in the oscillator wave, it may be desirable to reverse the rectifier poling specified above.

The features of the invention have been described with reference to several specific embodiments but it will be understood that these are merely illustrative applications of the principles of the invention. The several features of the invention may be combined in other ways and various modifications within the spirit and scope of the invention will readily occur to those skilled in the art.

What is claimed is:

1. In an oscillator, an amplifier having input and output circuits, a feedback connection from the output to the input circuit forming with the amplifier a feedback loop for causing the generation of oscillations, a plurality of piezoelectric crystals of different resonant frequencies and means for selectively utilizing any one of the crystals to determine the frequency of the oscillations while maintaining low capacity between said one crystal and all of the other crystals, comprising a relay for each crystal, normally connecting the crystal to ground, said crystals and their relays being arranged in banks, a relay for each bank, and means for selectively operating the crystal relays and the bank relays to disconnect a selected crystal from ground and connect it into the feedback loop.

2. In an oscillator according to claim 1 means including a code key for preparing operating circuits for the bank relays and selected crystal relays and a test key for successively completing the operating circuits.

3. In an oscillator the combination with an amplifier having input and output circuits, a feedback connection from the output to the input circuit forming with the amplifier a feedback loop for causing the generation of oscillations, a plurality of piezoelectric crystals having different resonant frequencies, a relay for each crystal normally connecting the crystal to ground, and keys for operating the relays selectively to disconnect one of the crystals from ground and connect it serially in the feedback loop to produce oscillations of the resonant frequency of the selected crystal, and a single protective means for all of the crystals actuated in accordance with the current through the selected crystal in the feedback loop for controlling the trans-conductance of the amplifier to prevent the application of excess potential or current to the selected crystal.

4. The combination with an oscillator having a feedback loop and a plurality of normally grounded piezoelectric crystals of different resonant frequencies, of switching means for preselecting a plurality of the crystals and other switching means for successively disconnecting the pre-selected crystals from ground and for connecting them into the feedback loop to condition the oscillator successively to generate oscillations of frequencies corresponding to the resonant frequencies of the pre-selected crystals.

5. The combination with an oscillatory circuit and a plurality of piezoelectric crystals of different resonant frequencies for selective connection into the circuit to determine its frequency of oscillation, of a plurality of sets of bank bus bars, a relay for each crystal for switching the crystal between ground and one set of the bus bars, a key for each relay for preselecting the relay for operation, a bank relay for each set of bus bars, a key for preparing operating circuits for all of the bank relays and all of the preselected relays and a test key for successively completing corresponding pairs of bank relay and preselected relay circuits for successively connecting preselected crystals into the oscillatory circuit.

6. In an oscillator, an amplifier having input and output circuits, a feedback connection from the output to the input circuit forming with the amplifier a feedback loop for causing the generation of oscillations, a plurality of piezoelectric crystals of different resonant frequencies, and means for selectively utilizing any one of the crystals to determine the frequency of the oscillations while maintaining low capacity between said one crystal and all of the other crystals, comprising a relay for each crystal normally connecting the crystal to ground, said crystals and their relays being arranged in banks, a relay for each bank and a key for each crystal for operating both the crystal relay and the corresponding bank relay to disconnect a selected crystal from ground and connect it into the feedback loop.

7. The combination with an oscillatory circuit, a piezoelectric crystal for determining the frequency of the oscillations and a load circuit, of means for regulating the current through the crystal and isolating the oscillatory circuit from the load comprising an amplifier having an input circuit energized in accordance with the amplitude of the crystal current and an output circuit, rectifying means associated with the output circuit for varying the impedance of the oscillatory circuit and connections to the load from the output circuit of the amplifier.

8. In an oscillator the combination with an amplifier having input and output circuits, a feedback connection from the output to the input circuit forming with the amplifier a feedback loop for causing the generation of oscillations and the piezoelectric crystal serially connected in the loop for determining the frequency of the oscillations, of a dual purpose control and buffer amplifier having an input circuit energized by a potential proportional to the current through the crystal and an output circuit including means for supplying power to a load and a rectifier for supplying bias potential to the amplifier in the feedback loop for controlling the amplitude of the current through the crystal.

9. In an oscillator the combination of two amplifiers serially connected together to form an oscillating loop circuit, a piezoelectric crystal serially connected in the loop circuit to fix the frequency of the oscillations at the series resonant frequency of the crystal, an impedance shunting the loop circuit between the crystal and one of the amplifiers and means for closely regulating the current through the crystal comprising a control amplifier having input and output circuits, a half wave rectifier in tandem with the control amplifier, circuit connections to the impedance for impressing on the input circuit of the control amplifier potential directly proportional to the oscillating current through the crystal, and circuit connections for applying a potential from the output of the rectifier to at least one of the serially connected amplifiers for controlling the gain of the amplifiers to confine the magnitude of the current through the crystal to the limited range suitable for operation of the crystal at its series resonant frequency, the pulses of one polarity in the output of the control amplifier containing less distortion than the pulses of the other polarity and the rectifier being selectively poled with respect to the control amplifier to rectify the pulses containing the lesser amount of distortion.

JAMES S. BELL.

References Cited in the file of this patent

UNITED STATES PATENTS

| Number | Name | Date |
|---|---|---|
| 2,263,755 | Bock | Nov. 25, 1941 |
| 2,369,953 | Downey | Feb. 20, 1945 |
| 2,441,570 | Glessner | May 18, 1948 |
| 2,444,349 | Harrison | June 29, 1948 |

FOREIGN PATENTS

| Number | Country | Date |
|---|---|---|
| 554,468 | Great Britain | July 6, 1943 |